(12) United States Patent
Liggett

(10) Patent No.: US 7,878,453 B2
(45) Date of Patent: Feb. 1, 2011

(54) PIEZOELECTRIC AND PYROELECTRIC POWER-GENERATING LAMINATE FOR AN AIRSHIP ENVELOPE

(75) Inventor: Paul E. Liggett, Wooster, OH (US)

(73) Assignee: Lockheed Martin Corporation, Bethesda, MD (US)

( * ) Notice: Subject to any disclaimer, the term of this patent is extended or adjusted under 35 U.S.C. 154(b) by 618 days.

(21) Appl. No.: 12/011,509

(22) Filed: Jan. 28, 2008

(65) Prior Publication Data

US 2009/0189012 A1 Jul. 30, 2009

(51) Int. Cl.
*B64B 1/14* (2006.01)
*H01L 41/00* (2006.01)

(52) U.S. Cl. .......................... 244/126; 244/30; 310/339

(58) Field of Classification Search ............. 244/24–33, 244/126, 53 R, 58, 59, 60; 310/339
See application file for complete search history.

(56) References Cited

U.S. PATENT DOCUMENTS

| 3,239,678 | A | * | 3/1966 | Kolm et al. ............... 307/43 |
| 4,241,128 | A | | 12/1980 | Wang .......................... 428/212 |
| 4,308,370 | A | | 12/1981 | Fukada et al. ............... 526/255 |
| 4,340,786 | A | | 7/1982 | Tester .......................... 179/110 |
| 5,891,581 | A | * | 4/1999 | Simpson et al. ............. 428/458 |
| 6,979,479 | B2 | | 12/2005 | Lavan et al. ................. 428/1.1 |
| 7,479,727 | B1 | * | 1/2009 | Grace ......................... 310/339 |
| 2005/0284147 | A1 | * | 12/2005 | Allen et al. ................ 60/641.8 |
| 2007/0074566 | A1 | * | 4/2007 | Roundy et al. ................ 73/146 |
| 2010/0264251 | A1 | * | 10/2010 | Facciano et al. ........... 244/3.15 |

* cited by examiner

*Primary Examiner*—Joshua J Michener
(74) *Attorney, Agent, or Firm*—Renner Kenner Greive Bobak Taylor & Weber

(57) ABSTRACT

A power-generating laminate for an airship comprises a base fabric layer, a barrier layer disposed upon the fabric layer, an inner metal film layer disposed upon the barrier layer, a piezoelectric/pyroelectric layer disposed upon the inner metal layer, an outer metal layer disposed upon the piezoelectric/pyroelectric layer, and a cover layer disposed upon the outer metal layer. The power-generating laminate forms a gas-impervious envelope to maintain lifting gas and air therein, and is configured such that when the envelope is subjected to structural strain or experiences changes in temperature, power is generated, which is used to supply power to the various electrical systems aboard the airship.

18 Claims, 2 Drawing Sheets

PIEZOELECTRIC AND PYROELECTRIC POWER-GENERATING LAMINATE FOR AN AIRSHIP ENVELOPE

TECHNICAL FIELD

Generally, the present invention relates to laminated films having both piezoelectric and pyroelectric properties. Particularly, the present invention relates to thin films having both piezoelectric and pyroelectric properties that are adapted for integration into an airship envelope. More particularly, the present invention relates to thin films having both piezoelectric and pyroelectric properties that are configured to generate power based on structural and thermal changes sustained by an airship during its flight.

BACKGROUND ART

Airships, such as blimps, dirigibles, aerostats, or any other lighter-than-air platform, including high-altitude airships, maintain a gas-impervious envelope that provides various discrete regions that separately contain air and a lifting-gas, such as helium or hydrogen. By varying the amount of air within the envelope, via a combination of electrically controlled blowers and valves, the elevation of the airship can be controlled. To navigate the airship in a desired direction or heading, a plurality of electrically powered propulsion units, such as propeller units for example, are disposed about the perimeter of the envelope. In addition to the systems used to maneuver the airship when in flight, the airship may include a gondola or other structure that contains the payload of the airship, which in addition to the various electronic navigation control systems contained therein, serves as a storage area for various electronic components that may be used while the airship is in flight. In particular, the payload may serve as a repository for various electronic devices such as research instrumentation, RF transceiving devices, analysis tools, or any other desired piece of equipment. Moreover, the role of airships continue to expand and, as such, are increasingly being used in research, entertainment and other endeavors, whereby a significant number of computers, sensors, transceivers, and other electronic components are carried aboard the airship and are in need of power supplies thereby. As such, it is evident that the requirements for electrical power aboard the airship are significant and are likely to continue to increase as the role of the airship expands beyond that of just flight.

Thus, to meet the energy demands required by the valves, blowers, and propulsion units, as well as the other electronic components maintained as part of the payload, a combination of rechargeable batteries, regenerative fuel cells and solar panels may be used as power sources aboard the airship. Thus during diurnal periods, when solar radiation from the sun is available, power aboard the airship is derived from the solar panels, which harvest the solar energy incident on the envelope of the airship. In addition to actively powering the electrical components aboard the airship, a portion of the unused solar energy is used to generate hydrogen and oxygen gasses by electrolysis of the waste water from the fuel cells or stored in rechargeable batteries that are maintained as part of the payload of the airship. During nocturnal periods, or those periods when solar energy from the sun cannot be harvested, the airship is restricted to operating on the power that it has stored in the rechargeable batteries and/or power generated by the fuel cells by the consumption of stored hydrogen and oxygen.

While the combination of the solar panels batteries and fuel cells provide an acceptable level of energy capacity, they suffer from various drawbacks. In particular, the rechargeable batteries are typically large, heavy, and consume a significant amount of the payload of the airship. For example, approximately 4,000 lbs. of batteries are typically needed to provide the power necessary to fully power the airship during its descent from altitude. In addition, the solar panels tend to be heavy and are susceptible to being easily broken or damaged. As such, the weight contributed by the batteries and solar panels currently utilized by airships negatively impacts the maneuverability of the airship, its ability to attain desired altitudes and traveling ranges, and thus serves as a significant limitation in overall performance of the airship. Furthermore, a substantial expense is also incurred to maintain, charge, and periodically replace failed batteries or fuel cells to ensure that the airship has optimal power capacity during its operation.

Therefore, there is a need for a power-generating laminate that is configured to be integrated into the envelope of an airship, which can harvest electrical power from the structural and thermal changes of the envelope associated with the operation of the airship. In addition, there is a need for a power-generating laminate that can harvest power from the structural expansion, contraction or strain otherwise imposed on the envelope of the airship during its operation. Furthermore, there is a need for a power-generating laminate that can harvest power from the thermal changes experienced by the envelope of the airship during its operation. Still yet, there is a need for a power-generating film that can generate power without occupying space within the payload of the airship. In addition, there is a need for a power-generating laminate that possesses both piezoelectric and pyroelectric properties.

SUMMARY OF INVENTION

In light of the foregoing, it is a first aspect of the present invention to provide a piezoelectric and pyroelectric power-generating laminate for an airship envelope.

Another aspect of the present invention is to provide an airship comprising a laminate configured to form a gas-impervious envelope, the laminate comprising a barrier layer, an inner metal layer disposed upon the barrier layer, the inner metal layer having a first terminal, a voltage-generating piezoelectric layer disposed upon the first metal layer, and an outer metal layer disposed upon the piezoelectric layer, the outer metal layer having a second terminal, wherein straining of the piezoelectric layer generates power at the first and second terminals.

Yet another aspect of the present invention is to provide a method of generating power aboard an airship providing a gas-impervious envelope comprising a power-generating laminate, varying the structural strain of the envelope, and generating power from the power-generating laminate as a physical property of the envelope changes.

BRIEF DESCRIPTION OF THE DRAWINGS

These and other features and advantages of the present invention will become better understood with regard to the following description, appended claims, and accompanying drawings wherein:

BEST MODE FOR CARRYING OUT THE INVENTION

Figure 1:
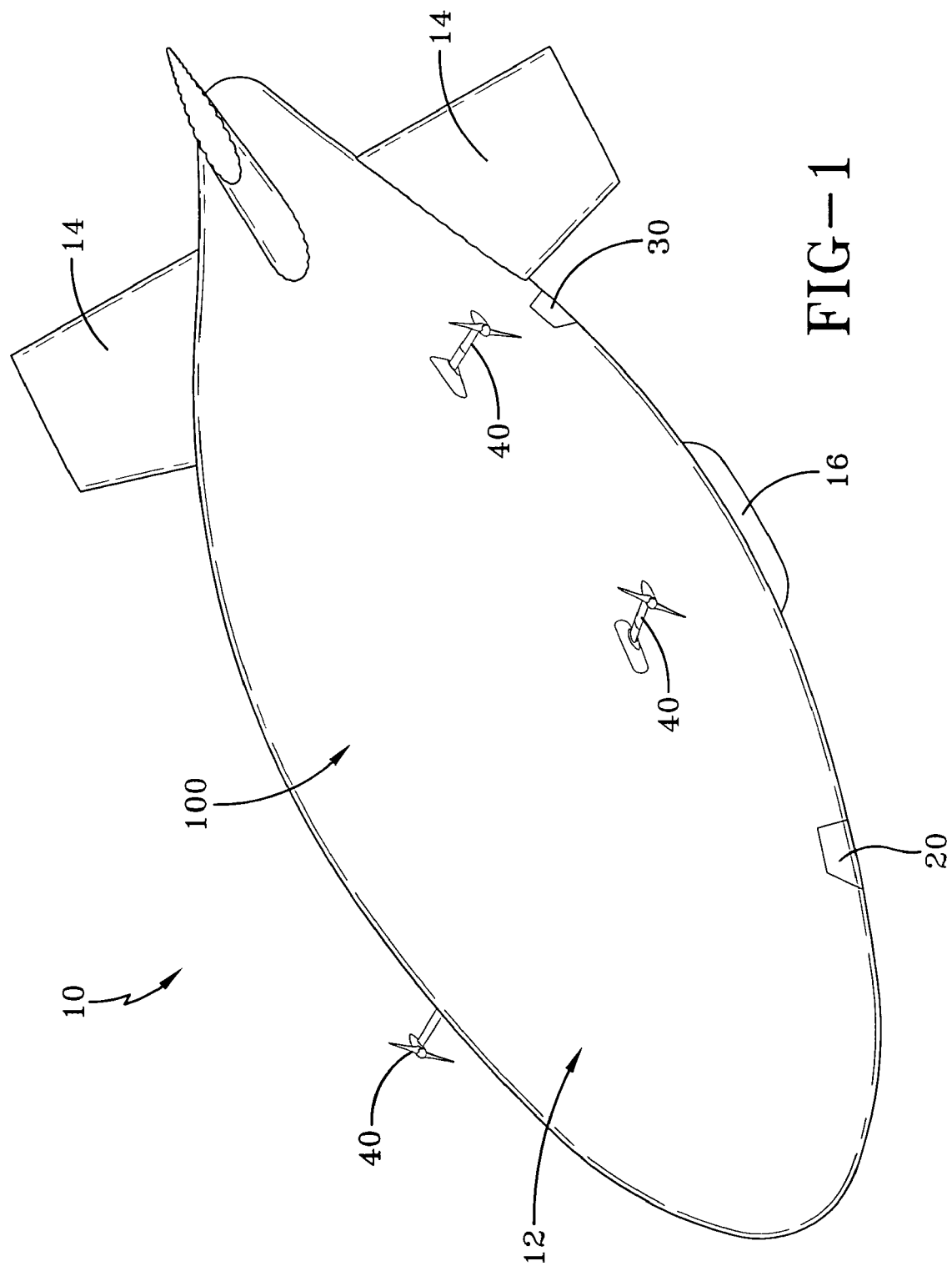
FIG. 1 is a perspective view of an airship utilizing a piezoelectric and pyroelectric power-generating laminate in accordance with the concepts of the present invention.

Before discussing the structural and functional aspects of the present invention, a brief discussion of the components associated with an airship, generally referred to by the numeral 10 in FIG. 1, will be presented, as it will assist the reader in understanding the invention. It should also be appreciated that while the discussion that follows is directed to that of an airship, such as a high-altitude airship, the discussion equally applies to any lighter-than-air platform, including but not limited to balloons, blimps, dirigibles, and aerostats.

Specifically, the airship 10 comprises a gas-impervious envelope 12 that is formed from a flexible laminate material or fabric that is made to withstand the pressure and temperature changes encountered by the airship 10 during ascent and descent, as well as, solar radiation that is encountered during its operation. Within the envelope 12 resides various discrete regions that separately contain air, and a lifting gas, such as helium. The combination of air and helium allow the airship 10 to be effectively controlled during ascent and descent. A plurality of fins 14 may be attached to the rear of the airship 10 to stabilize the airship 10 during flight. Carried beneath the airship 10 is a cargo payload 16 that may be configured to carry any desired equipment or personnel as desired. In one aspect, the payload 16 may serve to maintain a plurality of rechargeable batteries (not shown) used to power the various propulsion systems of the airship 10 when other power sources are unavailable. Skilled artisans will appreciate that the payload may be carried internally of the envelope 12.

To allow the airship 10 to ascend to altitude, the air containing regions within the envelope 12 are exhausted through a number of valves 20 disposed about the perimeter of the airship 10. The helium within the envelope 12 expands while the airship 10 ascends to the desired altitude. Alternatively, to descend the airship 10 from altitude, air is forced back into each air containing region by operation of one or more blowers 30. In flight, the airship 10 is navigated, or otherwise maneuvered, by a propulsion system. The propulsion system typically comprises a plurality of electrically powered propeller-based units 40 that are mounted externally to the envelope 12.

Thus, with the significant structural components of the airship 10 set forth, the following discussion will be directed to the structural composition of the envelope 12. In particular, the envelope 12 is formed from an envelope laminate 100 that provides both piezoelectric and pyroelectric properties that result in the generation of electrical power as the laminate 100 is subjected to various structural strain variations and thermal variations during the operating of the airship 10. Thus, as the envelope 12 of the airship 10 vibrates during operation, as well as when the envelope 12 expands and contracts due to the thermal effects of successive diurnal and nocturnal cycles, the piezoelectric properties of the envelope laminate 100 enable the generation of electrical power. In addition, because the airship 10 is exposed to the diurnal and nocturnal thermal variations of the sun, the envelope 12 is alternatingly heated and cooled. As a result of the pyroelectric properties of the envelope laminate 100, the cyclical thermal variations experienced by the envelope 12 of the airship 10 result in the generation of electrical power.

Figure 2:
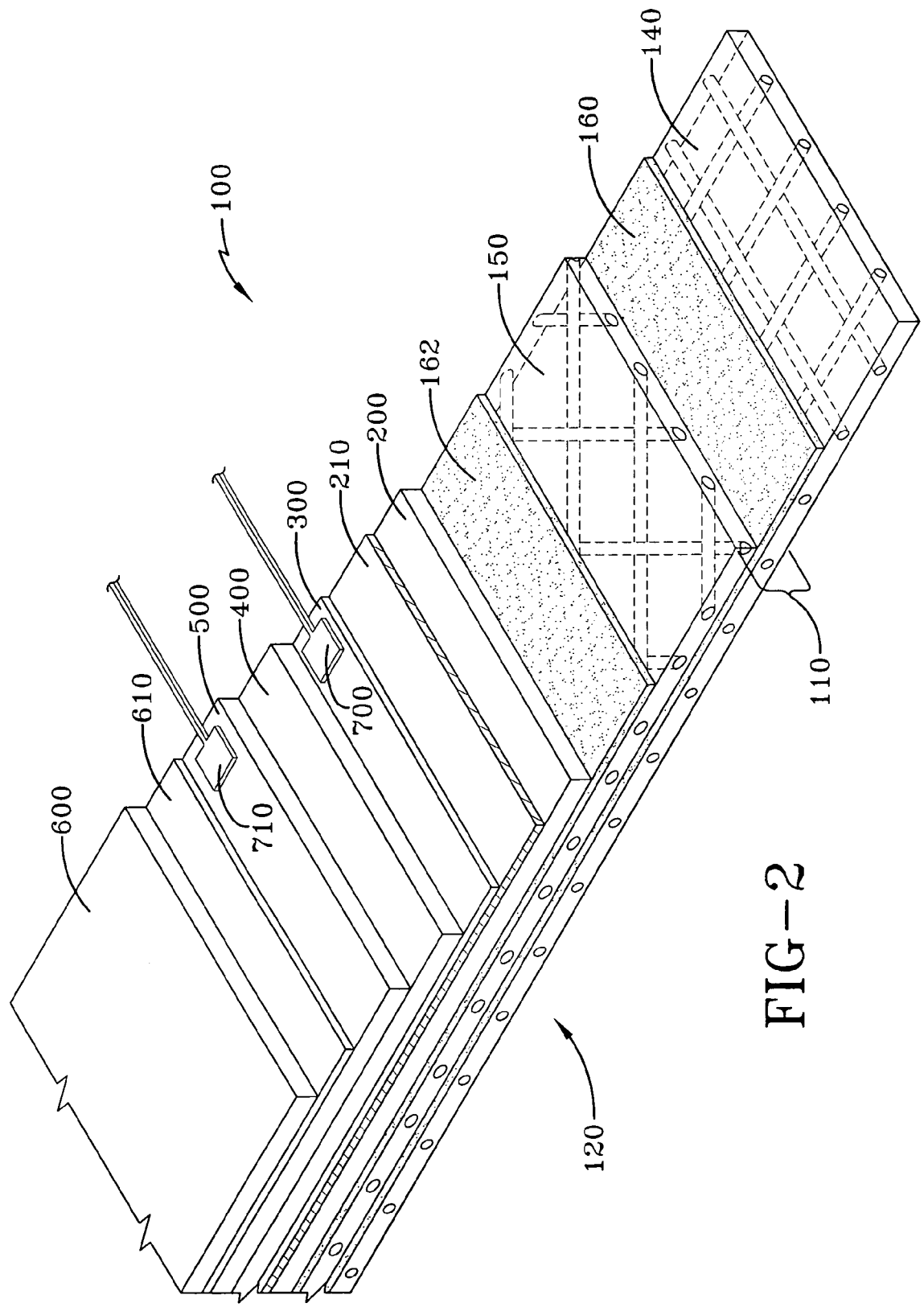
FIG. 2 is a perspective view of the various layers comprising the piezoelectric and pyroelectric power-generating laminate in accordance with the concepts of the present invention.

Continuing to FIG. 2, the envelope laminate 100 comprises a base fabric layer 110, which forms an inner volume 120 of the airship 10. The base fabric layer 110 is comprised of a straight-ply fabric 140 and a bias-ply fabric 150 that are bonded together by a suitable adhesive layer 160, such as thermoplastic polyurethane (TPU) or thermosetting adhesive for example. As such, the straight-ply fabric 140 provides an inner surface opposite the surface with the adhesive layer 160, that forms the inner surface of the inner volume 120. For the purpose of the following discussion, the use of the term "straight-ply" refers to a fabric comprised of warp and fill yarns that are substantially perpendicular to each other, while the term "bias-ply," as used herein, refers to a fabric comprised of warp and fill yarns that are perpendicular to each other, but are laminated to a straight-ply fabric, such that the warp and fill yarns of the bias-ply are approximately at a forty-five degree angle to the yarns of the straight-ply fabric. However, it will be appreciated that fabrics using woven and non-woven fibers, and provided with or without a bias orientation, could be used. It should be appreciated that the base fabric layer 110 may be comprised of high elongation fibers, so as to allow the envelope 12 to have an amount of expansion and contraction that optimizes the generation of electrical power by the envelope laminate 100.

Bonded upon the bias-ply fabric 150 via an adhesive layer 162 is a barrier layer 200. The barrier layer 200 may comprise polyamide material, such as KAPTON® branded material, which serves to provide an impervious or nearly impervious barrier to the escape of the air and lifting gas maintained within the inner volume 120 of the airship. Furthermore, the barrier layer 200 is comprised of dielectric material that electrically isolates the fabric layer 110 from the other layers disposed thereon.

Bonded upon the barrier layer 200 via an adhesive layer 210 is an inner metal layer 300. The inner metal layer 300 may comprise any suitable electrically conductive material, such as nickel, aluminum, copper, or alloys thereof. A piezoelectric layer 400, formed of piezoelectric material, such as polyvinylidene fluoride (PVDF), is disposed upon the inner metal layer 300. In one aspect, the piezoelectric layer 400 may comprise piezoelectric film, such as that sold under the brand Sensor Select by Measurement Specialties, Inc. of Hampton, Va. Disposed upon the piezoelectric layer 400 is an outer metal layer 500, formed from any suitable conductive material such as nickel, aluminum, copper, or alloys thereof. It should be appreciated that the inner and outer metal layers 300 and 500 may be laminated or otherwise bonded to the piezoelectric layer 400 via various processes in which films, such as thin films, may be formed. For example, the inner and outer metal layers 300, 500 may be disposed upon the piezoelectric layer 400 through processes including, but not limited to: sputtering, physical vapor deposition, and chemical vapor deposition that are suitable to form thin films.

Furthermore, while the barrier layer 200 serves as the primary barrier to the loss of lifting gas and air through the surface of the envelope 12, the inner and outer metal layers 300 and 500 further increase the impermeability of the envelope 12 and, as such, has the effect of extending the period in which lifting gas and air are retained within the envelope 12. In other words, the inner and outer metal layers 300 and 500 serve to further slow the gradual escape of the air and lifting gas from the inner volume 120 of the airship 10, which inherently occurs due to the nature of gas containing vessels, such as the airship 10.

To cover and protect the outer metal layer 500, is a cover layer 600, which is bonded thereto by an adhesive layer 610. In particular, the cover layer 600 may be formed of polyvinylidene fluoride (PVDF), and serves as a dielectric to electrically isolate the outer metal layer 500 from the external environment.

It should be appreciated that the PVDF film forming the piezoelectric layer 400 is typically formed by a process of rolling, stretching, annealing and exposing the film to a high-voltage field so as to modify and align the crystal structure of the film to enable it to possess piezoelectric and/or pyroelectric properties. As such, when the piezoelectric PVDF layer 400 is subjected to structural strain, it generates an electrical voltage, due to the piezoelectric effect that is proportional to the amount of strain to which it is subjected. That is, the piezoelectric layer 400 and associated inner and outer metal layers 300, 500 form a piezoelectric device which is able to generate electrical power when the envelope 12 of the airship 10 is strained. This electrical power may then be supplied to a power processing system (not shown) that is coupled to the metal layers 300 and 500 via respective electrical terminals 700 and 710, so as to provide power to the various electrical components maintained aboard the airship 10.

In addition to producing electrical power when the envelope 12 is structurally strained, the piezoelectric layer 400 also maintains pyroelectric properties, whereby it is capable of generating electrical power as it is heated and as it is cooled, and vice versa. Thus, as the envelope 12 is heated during diurnal periods and cooled during nocturnal periods, the piezoelectric layer 400 is able to generate electrical power.

Although, the electrical current produced due to the piezoelectric and pyroelectric effects of the laminate 100 are typically characterized by transient electrical voltage spikes that quickly return to zero if the laminate 100 maintains its existing shape or temperature, such limitations are overcome due to the slow and relatively constant expansion and contraction of the envelope 12 as the lifting gas responds to the thermal variations resulting from the cyclical diurnal and nocturnal heating and cooling effects of the sun. In other words, the envelope 12 tends to expand when heated by solar energy during the day, and contracts in the absence of the solar energy during the night, thus resulting in continuous cycle of expansion and contraction of the envelope 12. As a result, as the airship 10 is in operation, the piezoelectric layer 400 is subjected to continuous, or nearly continuous changes in structural strain, which result in a continuous, or nearly continuous veneration of electrical power. Furthermore, the operation of the propeller units 40 during flight induce vibrations into the envelope 12 of the airship 10, which also serve to impart an amount of varying strain at the piezoelectric layer 400 so as to generate electrical power.

Similarly, because the cyclical diurnal and nocturnal cycles to which the airship 10 is exposed, the heating and cooling of the airship 10 takes place over a long duration. As such, the change in temperature experienced by the piezoelectric layer 400 is continuous or nearly continuous, and thus the energy produced by the piezoelectric layer 400 due to the pyroelectric effect is continuous or nearly continuous as well.

Additionally, because the envelope laminate 100 also serves as a source of power both diurnally and nocturnally, the number of batteries maintained aboard the payload 16 of the airship 10, which are used to power the airship during nocturnal periods, may be reduced. As such, the effective range, maneuverability, and overall performance of the airship 10 are enhanced. Furthermore, because the laminate 100 is integrated into the envelope 12 of the airship 10, it provides a source of electrical power that does not consume valuable space within the payload 16 of the airship 10.

It will, therefore, be appreciated that one advantage of one or more embodiments of the present invention is that a power-generating laminate may be used to form an envelope of an airship. Another advantage of the present invention is that a power-generating laminate may provide piezoelectric and pyroelectric properties that are capable of generating electrical power in response to the changes in structural strain and temperature of the envelope. Yet another advantage of the present invention is that a power-generating laminate may provide piezoelectric and pyroelectric properties that enhance the impermeability of the airship so as to extend the duration in which the air and lifting gas are retained there within. Use of such a laminate is advantageous in the operation of an airship because piezoelectric and/or pyroelectric materials do not consume space within the payload of the airship and, as such, the quantity of rechargeable batteries needed to power the airship is reduced. Thus, the overall weight of the airship is reduced, thereby enhancing the maximum attainable elevation of the airship, extending flight ranges, and improving the overall performance of the airship while providing additional power that can be used to meet the future requirements of energy consumption aboard the airship.

Although the present invention has been described in considerable detail with reference to certain embodiments, other embodiments are possible. Therefore, the spirit and scope of the appended claims should not be limited to the description of the embodiments contained herein.

What is claimed is:

1. An airship comprising:
    a laminate configured to form a gas-impervious envelope of the airship, said laminate comprising:
      a barrier layer;
      an inner metal layer disposed upon said barrier layer, said inner metal layer having a first terminal;
      a voltage-generating piezoelectric layer disposed upon said first metal layer; and
      an outer metal layer disposed upon said piezoelectric layer, said outer metal layer having a second terminal;
    wherein straining of said piezoelectric layer generates power at said first and second terminals.

2. The airship according to claim 1, wherein variation of the temperature of said voltage-generating piezoelectric layer generates power at said terminals.

3. The airship according to claim 1, further comprising a base layer that carries said barrier layer, said base layer comprising a straight-ply fabric and a bias-ply fabric.

4. The airship according to claim 1, wherein said barrier layer comprises polyimide film.

5. The airship according to claim 1, wherein said voltage-generating piezoelectric layer comprises polyvinylidene fluoride (PVDF) film.

6. The airship according to claim 1, further comprising a cover layer disposed upon said second metal layer.

7. The airship according to claim 6, wherein said cover layer comprises polyvinylidene fluoride (PVDF) film.

8. The airship according to claim 1, wherein said voltage-generating layer is a piezoelectric film.

9. The airship according to claim 1, wherein said voltage-generating layer is a pyroelectric film.

10. The airship according to claim 1, wherein said voltage-generating layer is both a piezoelectric and pyroelectric film.

11. A method of generating power aboard an airship comprising:
    providing a gas-impervious envelope comprising a power-generating laminate;
    varying the structural strain of said envelope;
    generating power from said power-generating laminate as a physical property of said envelope changes;
    wherein providing said laminate comprises:
    providing a base layer;
    disposing a barrier layer upon said base layer;
    disposing an inner metal layer upon said barrier layer, wherein said base layer, said barrier layer, and said inner metal layer form a gas-impervious inner volume to retain at least a lifting gas therein;

disposing a piezoelectric layer upon said first metal layer; and disposing an outer metal layer upon said piezoelectric layer.

12. The method according to claim 11, wherein said generating step comprises:

straining said power generating laminate.

13. The method according to claim 11, wherein said base layer comprises a straight-ply fabric and a bias-ply fabric.

14. The method according to claim 11, wherein said barrier layer comprises polyimide film.

15. The method according to claim 11, wherein said piezoelectric layer comprises polyvinylidene fluoride (PVDF) film.

16. The method according to claim 11, further comprising:

disposing a cover layer upon said second metal layer.

17. The method according to claim 16, wherein said cover layer comprises polyvinylidene fluoride (PVDF) film.

18. The method according to claim 11, wherein said generating step comprises:

changing temperature of said power generating laminate.

* * * * *